(12) United States Patent
Ichikawa

(10) Patent No.: US 8,278,798 B2
(45) Date of Patent: Oct. 2, 2012

(54) CRYSTAL DEVICE

(75) Inventor: Ryoichi Ichikawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 183 days.

(21) Appl. No.: 12/928,293

(22) Filed: Dec. 8, 2010

(65) Prior Publication Data

US 2011/0140572 A1   Jun. 16, 2011

(30) Foreign Application Priority Data

Dec. 15, 2009   (JP) ................... 2009-283551
Nov. 12, 2010   (JP) ................... 2010-253512

(51) Int. Cl.
*H01L 41/08* (2006.01)
(52) U.S. Cl. ......... 310/312; 310/344; 310/367; 310/368
(58) Field of Classification Search .................. None
See application file for complete search history.

(56) References Cited

U.S. PATENT DOCUMENTS

| 4,124,809 | A | * | 11/1978 | Engdahl et al. | ............ 310/361 |
| 4,377,765 | A | * | 3/1983 | Kogure et al. | ............ 310/312 |
| 4,484,382 | A | * | 11/1984 | Kawashima | ............ 29/25.35 |
| 4,642,505 | A | * | 2/1987 | Arvanitis | ............ 310/312 |
| 5,283,496 | A | * | 2/1994 | Hayashi et al. | ............ 310/312 |

FOREIGN PATENT DOCUMENTS

| JP | 2002-185286 | 6/2002 |
| JP | 2005-159717 | 6/2005 |
| JP | 2008-047982 | 2/2008 |

* cited by examiner

*Primary Examiner* — Mark Budd
(74) *Attorney, Agent, or Firm* — Edwards Wildman Palmer LLP; Scott D. Wofsy

(57) ABSTRACT

An object is to provide a crystal device that uses a mesa-structure crystal piece in which frequency adjustment is possible. A configuration is such that in a crystal device having: a crystal piece having a thick portion and a thin portion, with an excitation electrode formed on both main faces of the thick portion, and a lead out electrode electrically connected to the excitation electrode, formed on an end portion; a container main body having a concavity for accommodating the crystal piece; and a cover that is connected to an open end face of the container main body and hermetically seals the crystal piece, a frequency adjustment metal film which is electrically isolated from the excitation electrode and made independent, is formed on the thin portion of the crystal piece.

7 Claims, 11 Drawing Sheets

(a)

(b)

(a)

(b)

(c)

(a)

(b)

(a)

(b)

(c)

(a)

(b)

CRYSTAL DEVICE

TECHNICAL FIELD

The present invention relates to a crystal device, in particular to a crystal device in which fine tuning of the frequency is possible.

BACKGROUND ART

Background of the Invention

A crystal device, for example a crystal oscillator, is known as a frequency controlling element, and is widely built into telecommunication equipment and digital controllers. As one of these, there is a crystal oscillator of a surface-mounted type (hereunder referred to as a surface-mounted oscillator) which uses a mesa structure crystal piece, and mass production of this is advancing.
(Example of Conventional Technique; Refer to Patent Document 1)

FIG. 8 is a diagram for explaining a conventional example of a surface mounted oscillator, wherein FIG. 8 (a) is a longitudinal cross-sectional view, FIG. 8 (b) is a perspective view of a crystal piece, and FIG. 8 (c) is a cross-sectional view on arrows A-A of the crystal piece in FIG. 8 (b).

The surface-mounted oscillator 1 shown FIG. 8 (a) is configured with a crystal piece 3a accommodated in a container main body 2 having a concavity 2e, and a cover 4 connected to an open end face of the container main body 2. The container main body 2 is made from ceramics, and is formed with a frame wall 2b laminated on a planar bottom wall 2a. On an inner bottom face 2c of the container main body 2 there is provided a crystal retention terminal 5. The crystal retention terminal 5 is electrically connected to a mount terminal 7 formed on an outer bottom face 2d of the container main body 2, via a conduction path 6.

The crystal piece 3a accommodated in the container main body 2, as shown in FIGS. 8 (b) and (c), is an approximate rectangular shape in plan view. Furthermore, it is a mesa type with a protuberance provided on both main faces of the crystal piece 3a to thereby form a thick portion 8 and a thin portion 9 surrounding the thick portion 8. On both main faces of the thick portion 8 there is formed an excitation electrode 10. From the excitation electrode 10 there is extended a lead out electrode 11 to the thin portion 9, on both sides of one end portion of the crystal piece 3a.

The excitation electrode 10 and the lead out electrode 11 are made as a laminated metal film with for example a bottom layer of Cr (chrome) and a top layer of Au (gold). Furthermore, the lead out electrode 11 is bonded to the crystal retention terminal 5 of the container main body 2 by means of an electroconductive adhesive 12. As a result, the crystal piece 3a is fixed to the inner bottom face 2c of the container main body 2, and accommodated in the container main body 2. Furthermore, the excitation electrode 10 is connected electrically to the mount terminal 7.

The cover 4 connected to the open end face of the container main body 2 is made from a Kovar in which Fe (iron) is the main component to which is added Ni (nickel) and Co (cobolt). The surface of the cover 4 has a Ni film (not shown in the drawing) formed for example by electroplating. Furthermore, the cover 4 is connected to the open end face of the container main body 2 by for example seam welding, so that the crystal piece 3a is hermetically sealed inside the container main body 2.

In such a surface mounted oscillator 1, the frequency is adjusted in the following manner. At first, the excitation electrode 10 is formed on the crystal piece 3a so that this gives a frequency lower than a target frequency. More specifically, the greater the mass of the excitation electrode 10 the lower the frequency. Therefore, the mass of the excitation electrode 10 is made greater than the mass of the excitation electrode 10 corresponding to the target frequency. Next, argon ions are irradiated onto the excitation electrode 10 (refer to arrow B of FIG. 9), so that the metal becomes a mist, to thereby trim the excitation electrode 10. Hence, the mass (thickness) of the excitation electrode 10 is reduced. As a result, the frequency of the crystal piece 3a becomes higher, and can be adjusted to the target frequency.

PRIOR ART DOCUMENTS

Patent Document 1: Japanese Unexamined Patent Publication No. 2005-159717
Patent Document 2: Japanese Unexamined Patent Publication No. 2002-185286
Patent Document 3: Japanese Unexamined Patent Publication No. 2008-47982

SUMMARY OF THE INVENTION

Problems that the Invention is to Solve (Problem of the Conventional Technique)

However, in the conventional surface mounted oscillator 1 of the above described configuration, there is a problem in that it is difficult to fine tune the frequency with sufficient accuracy. That is to say, since the crystal piece 3a is a mesa-structure, the vibration energy is concentrated on the thick portion 8 on which the excitation electrode 10 is formed. Hence, the change in mass of the excitation electrode 10 has a large influence on the vibration of the crystal piece 3a. Consequently, when the mass of the excitation electrode 10 is reduced by trimming the excitation electrode 10, there is often a situation where the range allowed for fine tuning is exceeded, so that the frequency of the crystal piece 3a becomes high, resulting in a problem in that fine tuning of the frequency becomes difficult.

Object of the Invention

An object of the present invention is to provide a crystal device that uses a mesa-structure crystal piece in which frequency adjustment is possible.

Means to Solve the Problem (Specific Points and their Problems)
In the above Patent Documents 2 and 3, there is proposed a crystal piece in which frequency adjustment is possible. More specifically, this is one where frequency adjustment is performed by trimming a frequency adjustment metal film provided on an outside area of an excitation electrode (refer for example to paragraphs 0023 and 0049 of Patent Document 3). The present invention focuses on this frequency adjustment metal film.

The crystal piece disclosed in Patent Documents 2 and 3 is described referring to FIG. 10. The crystal piece 3b shown in FIG. 10 is in the form of a flat plate (refer to FIG. 10 (a)). Furthermore, the excitation electrode 10 is formed on both main faces, and the lead out electrode 11 is extended from the excitation electrode 10 to both sides of one end portion of the crystal piece 3b. Moreover, on the other end portion of one main face of crystal piece 3b there is formed a frequency adjustment metal film 13 which is electrically isolated from the excitation electrode 10 and made independent.

Next, the following frequency adjustment is performed for the crystal piece 3b. At first, similarly to as described before, argon ions are irradiated onto the excitation electrode 10 (refer to arrow D of FIG. 10 (b)), to effect trimming, and thereby perform course adjustment of the frequency of crystal piece 3b. Next, argon ions are irradiated onto the frequency adjustment metal film 13 (refer to arrow E of FIG. 10 (b)), to effect trimming, and thereby perform fine adjustment of the frequency of crystal piece 3b. The reason why the frequency can be fine adjusted by trimming of the frequency adjustment metal film 13, is because the frequency adjustment metal film 13 is formed on an area separated from the area where the excitation electrode 10 is formed, and hence the influence on the frequency change is small (refer to paragraph 0023 of Patent Document 3).

However, the crystal piece 3b disclosed in Patent Documents 2 and 3 is in the form of a flat plate. Therefore, in the crystal piece of mesa-structure, it is not clear how the frequency adjustment metal film 13 should be formed.

In general, it is considered to form the frequency adjustment metal film 13 in an area of the same thickness as the excitation electrode 10, similarly to the crystal piece 3b shown in Patent Documents 2 and 3. The crystal piece 3c in this case is explained referring to FIG. 11. The excitation electrode 10 is formed on both main faces of the thick portion 8 of the crystal piece 3c. Furthermore, the frequency adjustment metal film 13 which is electrically isolated from the excitation electrode 10 and made independent, is formed on one main face of the thick portion 8.

However, in such a crystal piece 3c, since this is of mesa-structure, the vibration energy is concentrated at the thick portion 8. Therefore, a mass change of the frequency adjustment metal film 13 which is formed on the thick portion 8 has a significant influence on the frequency. Consequently, fine adjustment of the frequency by trimming the frequency adjustment metal film 13 is difficult.

Furthermore, in the crystal piece 3c, in order to efficiently generate vibration energy in the thick portion 8, it is necessary to form the excitation electrode 10 on a wide area of the thick portion 8. However, if the frequency adjustment metal film 13 is formed on the thick portion 8, sufficient area for the excitation electrode 10 cannot be ensured by that amount, so that the generation efficiency for the vibration energy is reduced. In particular, due to recent miniaturization of the crystal device, miniaturization of the plane exterior of the crystal piece 3c is also advancing, and hence there are significant problems.

(Solution)

In the present invention, the configuration is such that in a crystal device having: a crystal piece having a thick portion and a thin portion, with an excitation electrode formed on both main faces of the thick portion, and a lead out electrode electrically connected to the excitation electrode, formed on an end portion; a container main body with the crystal piece accommodated in a concavity; and a cover that is connected to an open end face of the container main body and hermetically seals the crystal piece, a frequency adjustment metal film which is electrically isolated from the excitation electrode and made independent is formed on the thin portion of the crystal piece.

Effects of the Invention

According to this configuration, the excitation energy of the crystal piece is concentrated in the thick portion. Hence, even if the mass of the frequency adjustment metal film formed in the thin portion is changed, the influence on the vibration is minimal. Consequently, fine adjustment of the frequency is performed by trimming the frequency adjustment metal film. Furthermore, the frequency adjustment metal film is formed on the thin portion. Consequently, it is no longer necessary to reduce the area of the excitation electrode formed on the thick portion. Furthermore, even if the crystal piece is miniaturized, sufficient area for the excitation electrode can be maintained.

EMBODIMENTS

In the present invention, the configuration is such that the frequency adjustment metal film is formed on an area separated from the thick portion which is an outer peripheral portion of the crystal piece. As a result, the distance between the excitation electrode and the frequency adjustment metal film can be maintained. Hence, influence on the vibration when the frequency adjustment metal film is trimmed can be further reduced. Consequently, frequency adjustment with even higher accuracy becomes possible.

BEST MODE FOR CARRYING OUT THE INVENTION

First Embodiment

Figure 1:
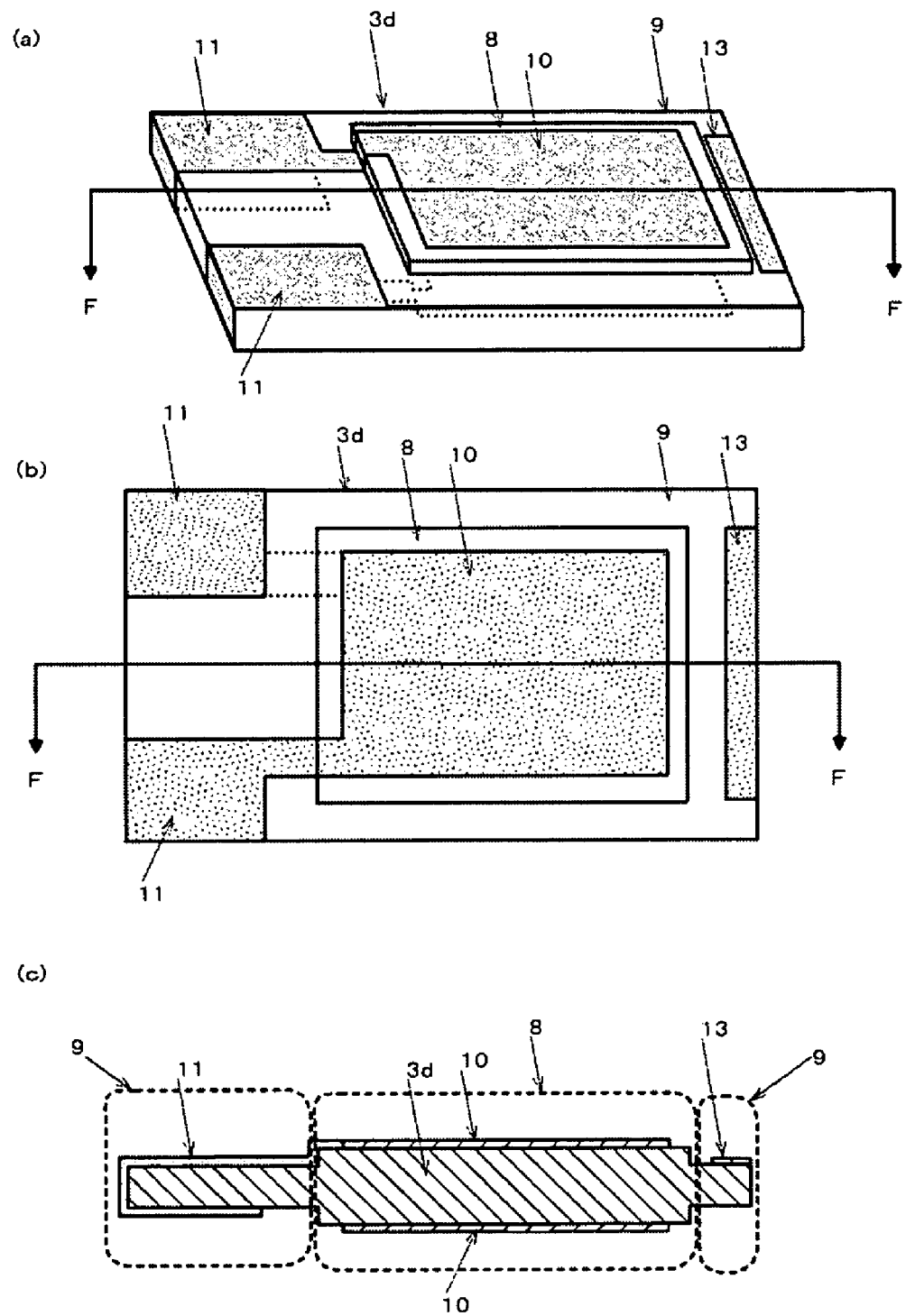
FIG. 1 is a diagram for explaining a first embodiment of a crystal piece of a crystal device of the present invention, wherein (a) is a perspective view, (b) is a plan view, and (c) is a cross-sectional view on arrow F-F of (b).

FIG. 1 is a diagram for explaining a first embodiment of a crystal piece used in a crystal device of the present invention, wherein FIG. 1 (*a*) is a perspective view, FIG. 1 (*b*) is a plan view, and FIG. 1 (*c*) is a cross-sectional view on arrow F-F in FIG. 1 (*a*) and FIG. 1 (*b*). Parts the same as in the conventional example are denoted by the same reference symbols and description thereof is simplified or omitted.

Figure 8:
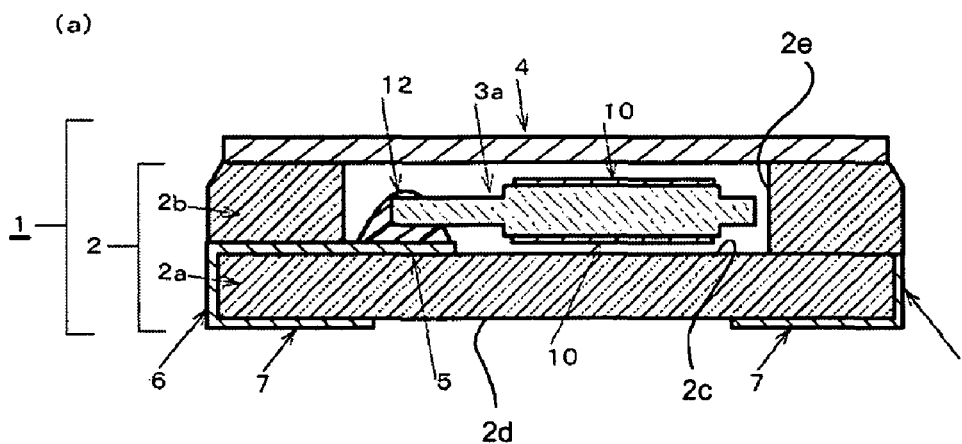
FIG. 8 is a diagram for explaining a conventional example of a surface mounted oscillator, wherein (a) is a longitudinal cross-sectional view, (b) is a perspective view of a crystal piece, and (c) is a cross-sectional view on arrow A-A of the crystal piece in (b).
Figure 8:
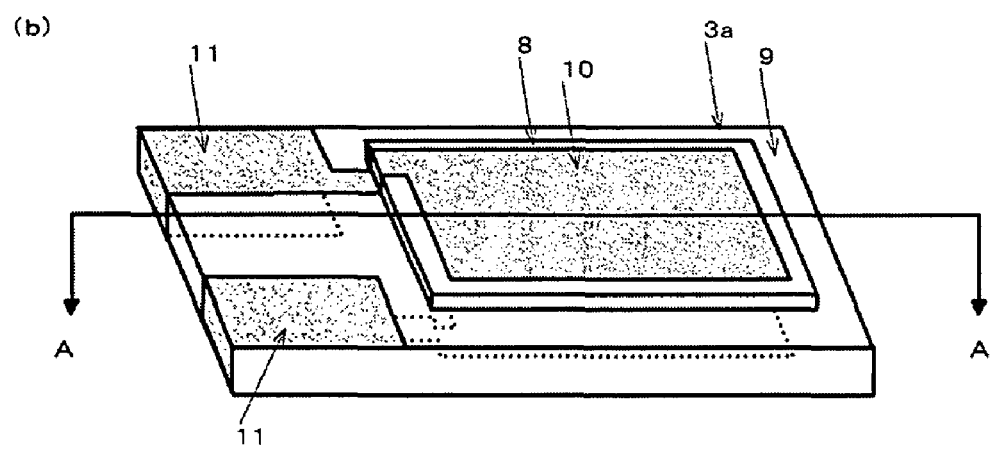
Figure 8:
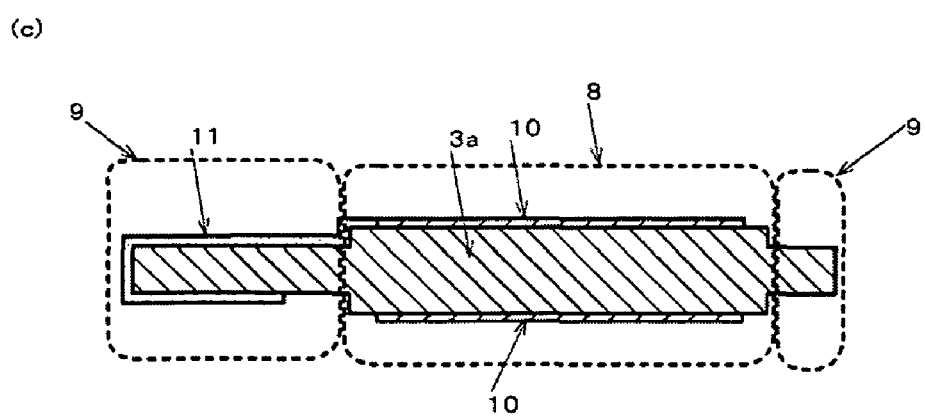
Figure 9:
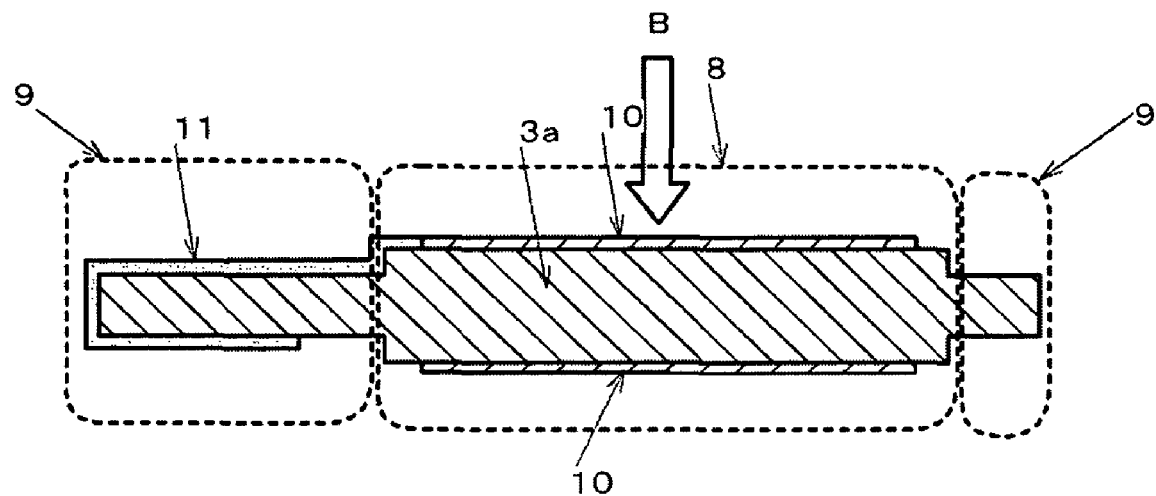
FIG. 9 is a diagram for explaining a conventional example of a frequency adjustment method.
Figure 10:
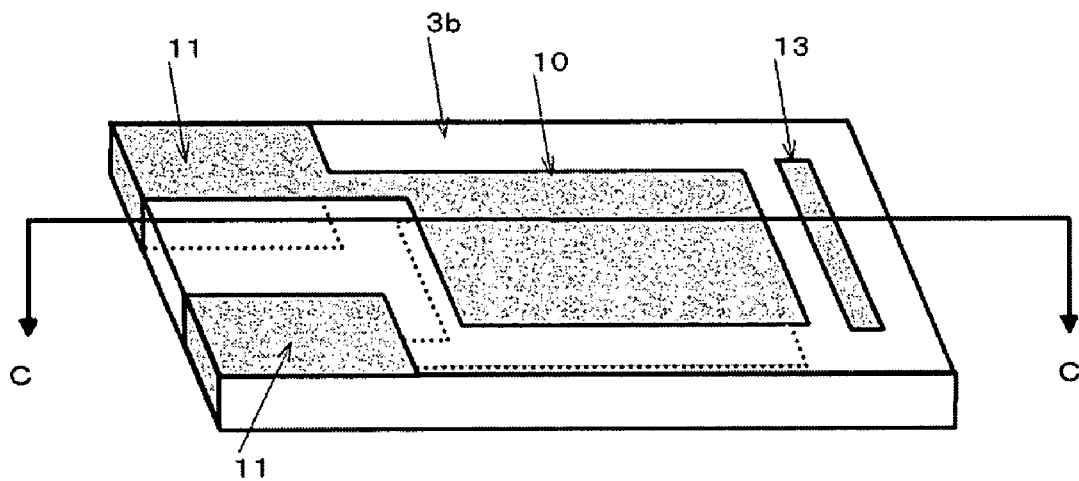
FIG. 10 is a diagram for explaining another conventional example of a crystal piece, wherein (a) is a perspective view, and (b) is a cross-sectional view on arrow C-C in (a).
Figure 10:
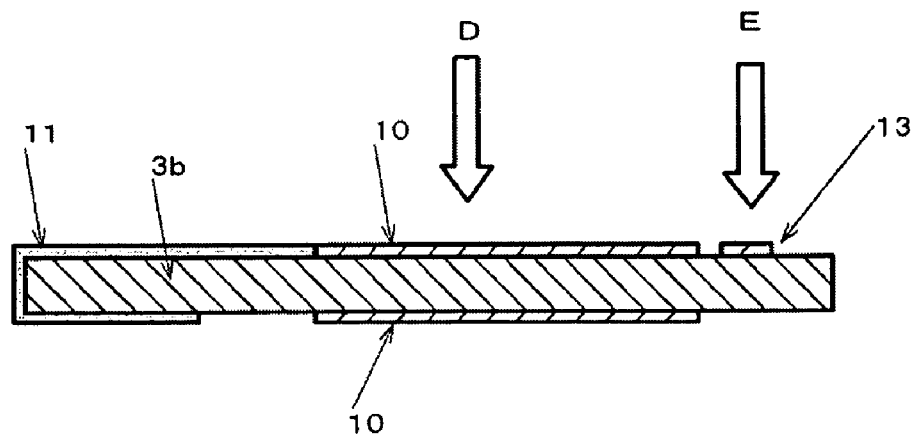
Figure 11:
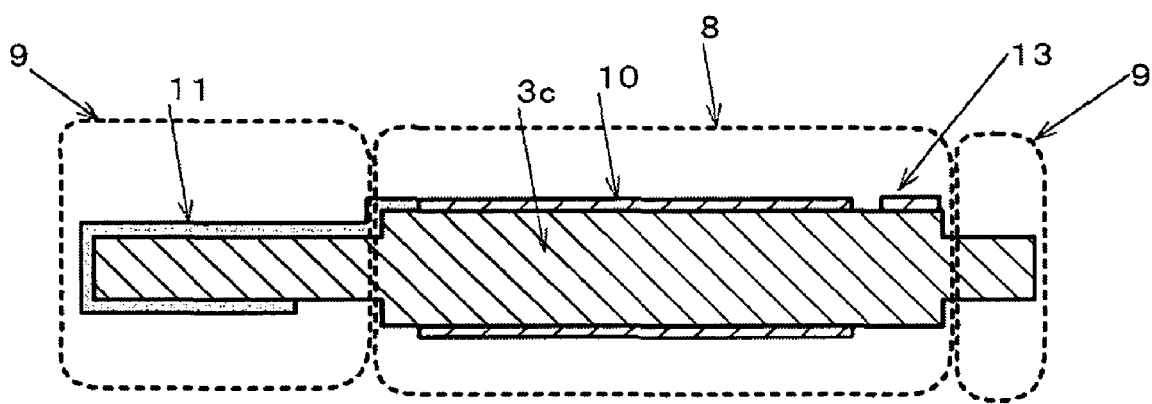
FIG. 11 is a diagram of a crystal piece combined with a conventional example.

In the surface mounted oscillator 1 of this embodiment being a crystal device of the present invention, similar to the conventional example shown in FIG. 8 (*a*), the configuration is such that a crystal piece 3*d* is accommodated in a container main body having a concavity 2*e*, and a cover 4 is connected to an open end face of the container main body 2. The container main body 2 is made from ceramics and the cover 4 is made from Kovar.

The crystal piece 3*d*, as shown in FIG. 1 is approximately rectangular in plan view. Furthermore, a protuberance is provided in both main faces of the crystal piece 3*d* to thereby form a thick portion 8, and a thin portion 9 surrounding the thick portion 8. On both main faces of the thick portion 8 there is formed an excitation electrode 10, and a lead out electrode 11 which is on both sides of one end portion of the crystal piece 3*b*, is extended from the excitation electrode 10 to the thin portion 9. Furthermore, at the other end of the outer peripheral portion in the one main face of the crystal piece 3*d* in the area separated from the thick portion 8, there is formed a frequency adjustment metal film 13 which is electrically isolated from the excitation electrode 10 and made independent. The excitation electrode 10, the lead out electrode 11, and the frequency adjustment metal film 13 are made as a laminated metal film with for example a bottom layer of Cr (chrome) and a top layer of Au (gold).

With such a device, at first, the thick portion 8 of the crystal piece 3*d* is formed by for example wet etching from a crystal wafer. Next, by means of an evaporation method or a sputtering method, the excitation electrode 10, the lead out electrode 11, and the frequency adjustment metal film 13 are formed with a bottom layer of Cr, and a top layer of Au. Next, the crystal wafer is diced to form individual pieces of the crystal piece 3*d*. Furthermore, the crystal piece 3*d* is fixed to the inner bottom face 2*c* of the container main body 2 using an electroconductive adhesive 12.

Figure 2:
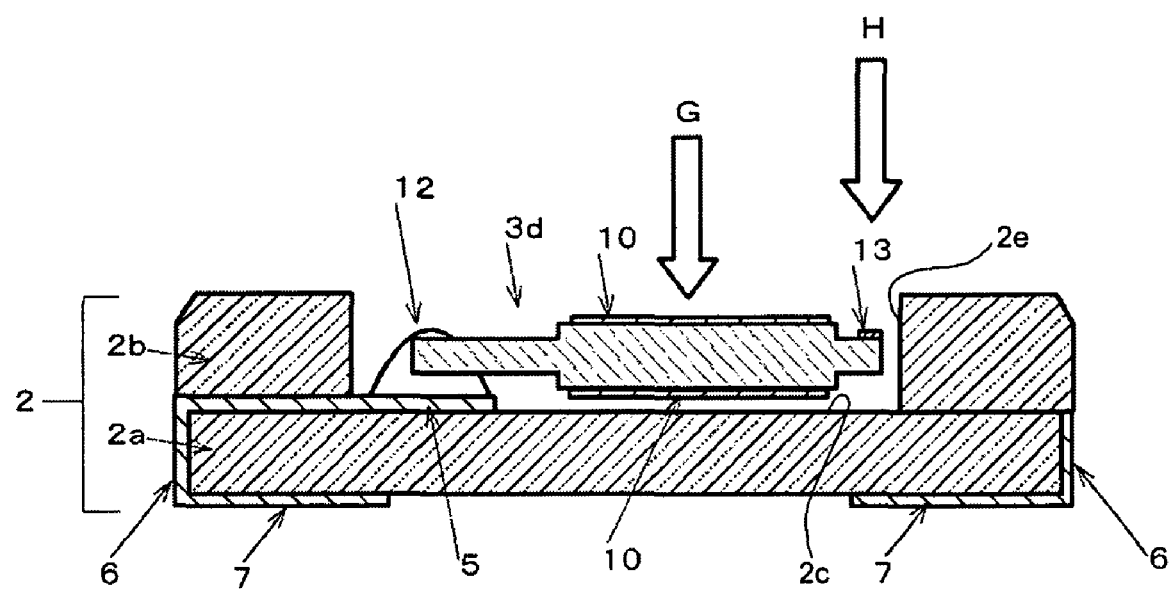
FIG. 2 is a diagram for explaining a frequency trimming method of a first embodiment of a crystal piece of a crystal device of the present invention.

Next, frequency adjustment is performed. At first, the excitation electrode 10 is trimmed by irradiating a laser or ion beam onto the excitation electrode 10 (refer to arrow G of FIG. 2), to course adjust the frequency of the crystal piece 3*d*. Then the frequency adjustment metal film 13 is trimmed by irradiating a laser or ion beam onto the frequency adjustment metal film 13 (refer to arrow H of FIG. 2), to fine adjust the frequency of the crystal piece 3*d*. Here, for the ion beam, for example an argon ion beam is used.

Next, the cover 4 is connected to the open end face of the container main body 2 by for example seam welding. As a result, the crystal piece 3*d* is hermetically sealed inside the container main body 2.

According to this configuration, the excitation energy of the crystal piece 3*d* is concentrated in the thick portion 8. Hence, even if the mass of the frequency adjustment metal film 13 formed on the thin portion 9 is changed, the influence on the vibration is minimal. Consequently, fine adjustment of the frequency of the crystal piece 3*d* is performed by trimming the frequency adjustment metal film 13. Furthermore, the frequency adjustment metal film 13 is formed on the thin portion 9. Consequently, it is not necessary to reduce the area of the excitation electrode 10 formed on the thick portion 8. Furthermore, even if the crystal piece 3*d* is miniaturized, sufficient area of the excitation electrode 10 can be maintained.

Moreover, the frequency adjustment metal film 13 is formed on the outer peripheral portion of the crystal piece 3*d* that is separated from the thick portion 8 of the crystal piece 3*d*. As a result, a predetermined distance can be maintained between the excitation electrode 10 and the frequency adjustment metal film 13. Hence, the influence on the vibration when trimming the frequency adjustment metal film 13 can be further reduced. Consequently, fine adjustment of the frequency of the crystal piece 3*d* at even higher accuracy becomes possible.

Modified Example of First Embodiment

Figure 3:
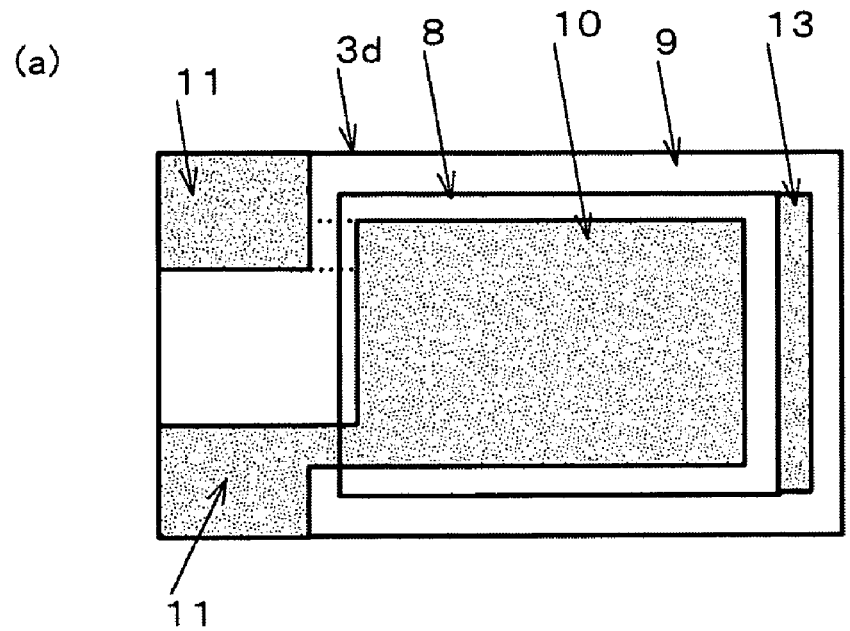
FIG. 3 is a plan view for explaining a modified example of the first embodiment of a crystal piece of a crystal device of the present invention.
Figure 3:
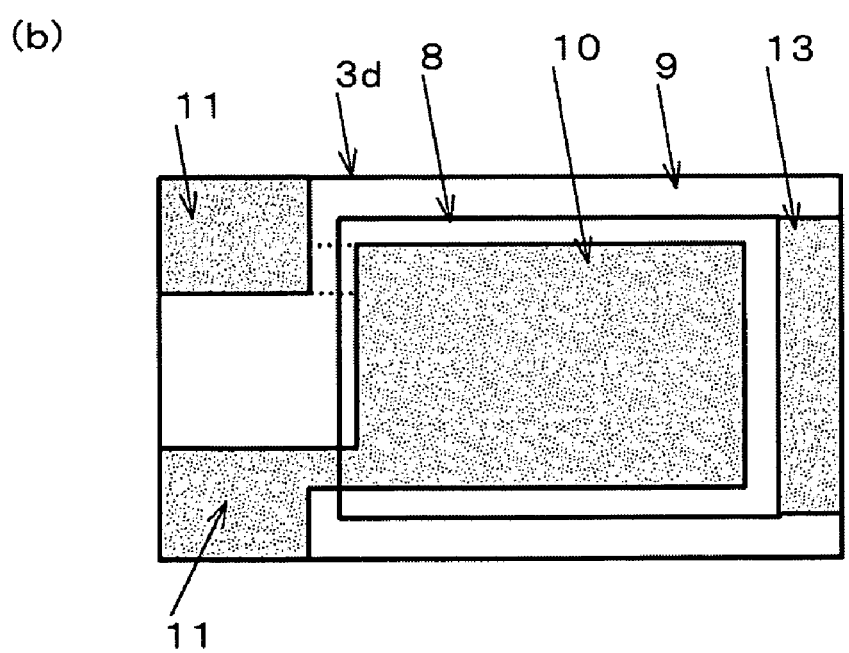

In the present invention, the formation site of the frequency adjustment metal film 13 is variously considered. For example, the frequency adjustment metal film 13, as shown in FIG. 3 (*a*), may be formed on one end portion of the crystal piece 3*d*, on the rim between the thick portion 8 and the thin portion 9. As a result, the metal evaporated from the frequency adjustment metal film 13 due to trimming becomes a wall on the side face of the thick portion 8, so that the possibility of adhering to the excitation electrode 10 is reduced. Consequently, the influence of the trimming of the frequency adjustment metal film 13 on the frequency characteristics of the surface-mounted oscillator 1 can be reduced.

Figure 4:
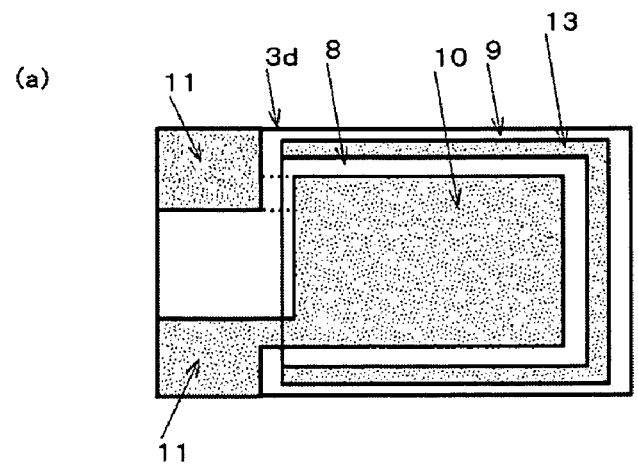
FIG. 4 is a plan view for explaining a further modified example of the first embodiment of a crystal piece of a crystal device of the present invention.
Figure 4:
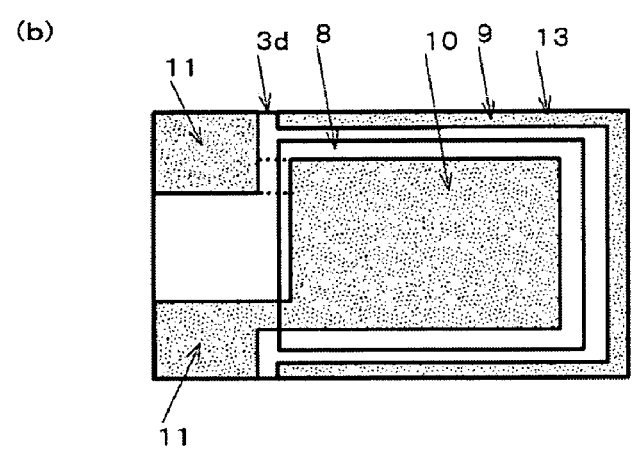
Figure 4:
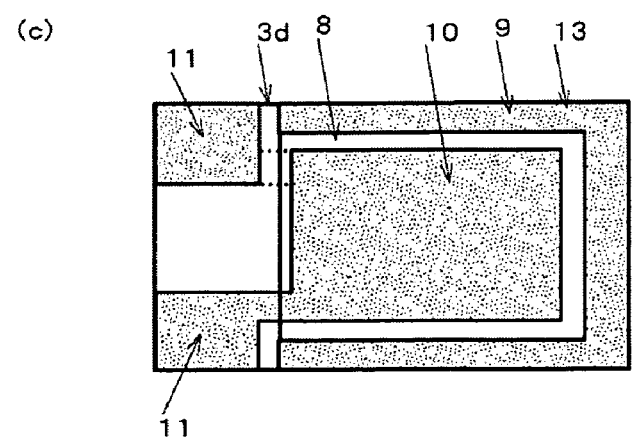

Furthermore, the frequency adjustment metal film 13, as shown in FIG. 3 (*b*), may be formed on one end portion of the crystal piece 3*d*, spanning from the rim between the thick portion 8 and the thin portion 9 to the outer edge portion of the crystal piece 3*d*. As a result, the amount of the frequency adjustment metal film 13 becomes large, so that the frequency adjustment range is widened. Furthermore, as shown in FIG. 4 (*a*) through (*c*), the frequency adjustment metal film 13 may be formed so as to surround the thick portion 8. Moreover, the frequency adjustment metal film 13 may be formed on both main faces of the crystal piece 3*d*. Even if irradiation of the laser is from one main face of the crystal piece 3*d*, trimming of the frequency adjustment metal film 13 on both main faces is possible, and hence the frequency adjustment range is widened.

Second Embodiment

Figure 5:
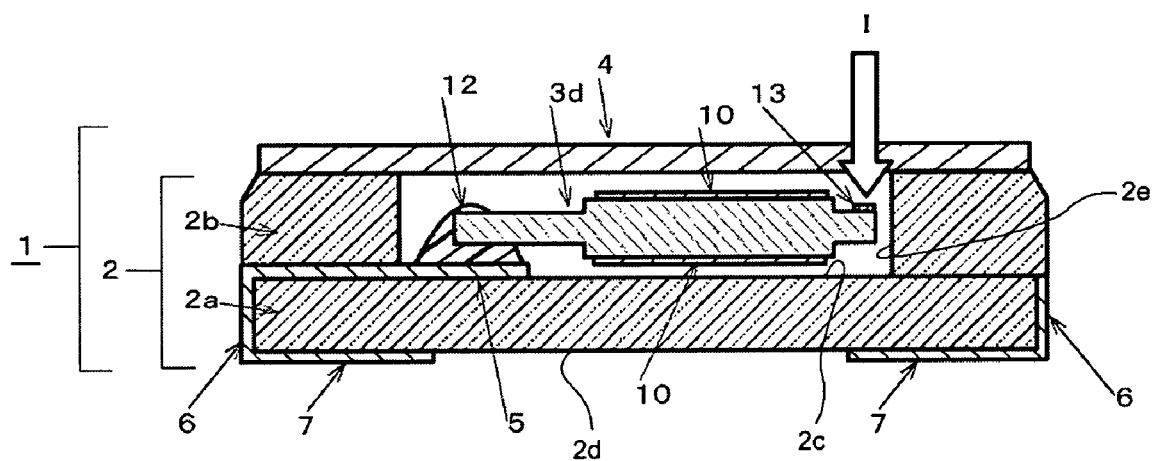
FIG. 5 is a longitudinal cross-sectional view of a surface mounted oscillator of a second embodiment of a crystal device of the present invention.

FIG. 5 is a longitudinal cross-sectional view for explaining a second embodiment of a surface mounted oscillator corresponding to a crystal device of the present invention. Parts the same as in the above-mentioned embodiment are denoted by the same reference symbols and description thereof is simplified or omitted.

The present embodiment differs from the abovementioned first embodiment in that the cover 4 is made from glass having transmittance. In connecting the glass cover 4 and the ceramic container main body 2, a solder connection or the like can be used.

With such a device, the following frequency adjustment is performed. At first, before connecting the cover 4 to the container main body 2, the excitation electrode 10 is course adjusted by trimming. Then, the cover 4 is connected to the container main body 2. Next, the frequency adjustment metal film 13 is trimmed by irradiating a laser through the cover 4 onto the frequency adjustment metal film 13 (refer to arrow I of FIG. 5), to fine adjust the frequency of the crystal piece 3*d*.

According to such a configuration, this can be adjusted to a target frequency with good accuracy. That is to say, before and after connecting the cover 4, it is known that the frequency changes due to changes and the like in the pressure applied to the crystal piece 3*d*. In this second embodiment, as described above, the frequency is fine tuned after connecting the cover 4. Consequently, this can be adjusted to a target frequency with good accuracy.

Third Embodiment

Figure 6:
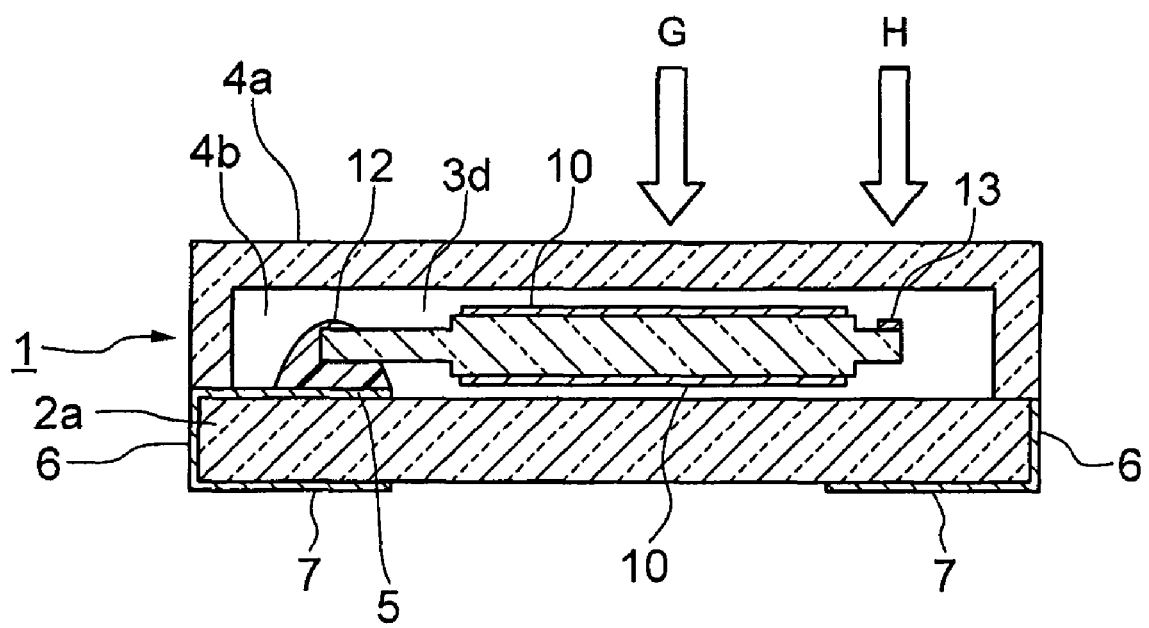
FIG. 6 is a longitudinal cross-sectional view of a surface mounted oscillator of a third embodiment of a crystal device of the present invention.

FIG. 6 is a longitudinal cross-sectional view for explaining a third embodiment of a surface mounted oscillator corresponding to a crystal device of the present invention.

In this embodiment, different to the aforementioned first embodiment, instead of the cover 4, a lid 4a having a concavity 4b of a rectangular cross-section shape, is covered to seal a crystal piece 3d.

That is to say, in the third embodiment, as shown in FIG. 6, the crystal piece 3d is mounted on an upper face 2c of a base 2a made from a glass or crystal, by means of an electroconductive adhesive 12 via a crystal retention terminal 5, and the lid 4a made from glass or crystal and having the concavity 4b is covered over the base 2a, to thereby seal the crystal piece 3d inside the concavity 4b. Furthermore, a peripheral edge portion of the base 2a and the lid 4a is connected by anodic bonding or various bonding materials.

Next is a description of a method of manufacturing the surface mounted oscillator 1 of the third embodiment. At first the electrodes and the like are formed on a base wafer. Next, a concavity is formed in the lead wafer by etching. Furthermore, unitized crystal pieces 3d are mounted on the base wafer. After this, the lead wafer is connected to the base wafer by the aforementioned method, and then the connected wafer is cut by dicing, to form the individual pieces of the crystal oscillator 1.

Furthermore, as a modified example of the third embodiment, instead of forming the concavity 4b that seals and accommodates the crystal piece 3d, in the lid 4a, this may be formed in the upper face of the base 2a.

With such a device, in a similar manner to the aforementioned second embodiment, the excitation electrode 10 is trimmed and course adjusted (arrow G), and then a laser is irradiated through the lid 4a onto the frequency adjustment metal film 13 (arrow H), to fine adjust the frequency of the crystal piece 3d.

Fourth Embodiment

Figure 7:
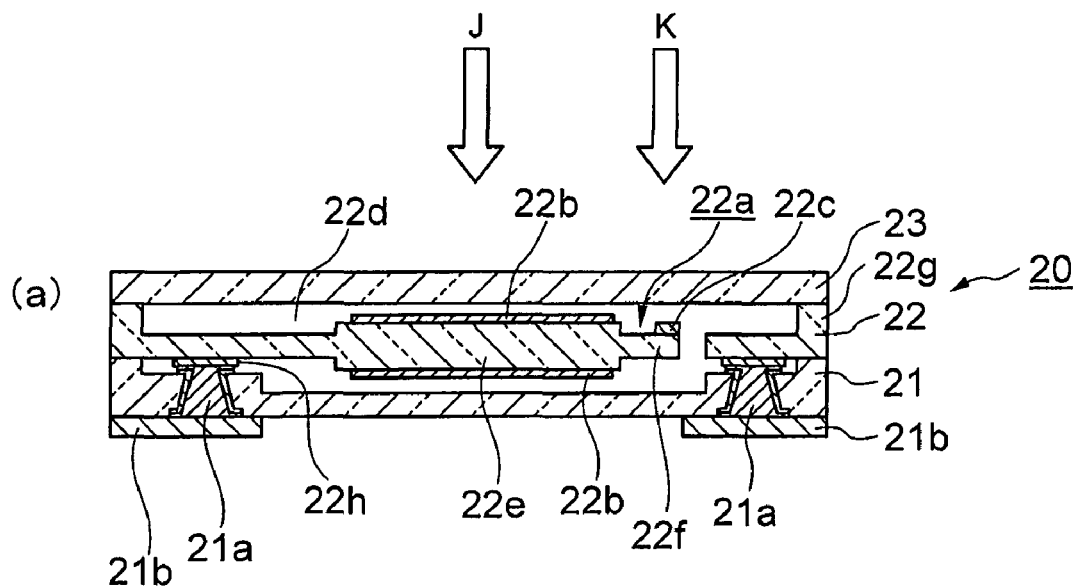
FIG. 7 is a diagram for explaining a surface mounted oscillator of a fourth embodiment of a crystal device of the present invention, wherein (a) is a longitudinal cross-sectional view, and (b) is a perspective view of the crystal substrate viewed from above.
Figure 7:
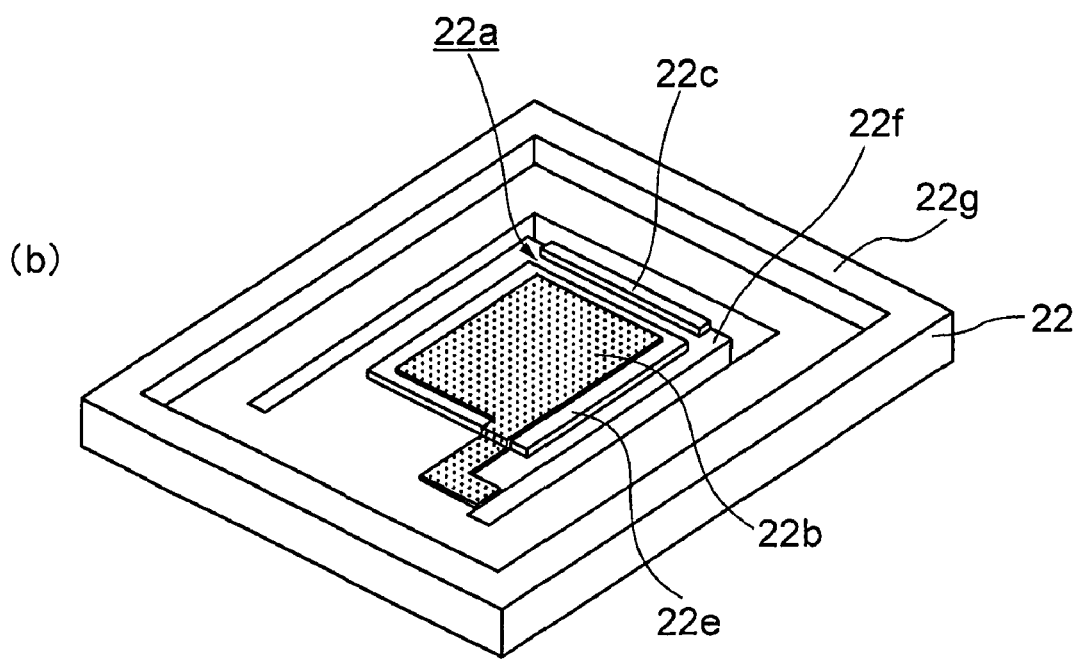

FIG. 7 is a longitudinal cross-sectional view for explaining a fourth embodiment of a surface mounted crystal oscillator corresponding to the crystal device of the present invention.

In this embodiment, a lid wafer and a framed crystal piece wafer are connected, and then a base wafer is laminated and formed on the framed crystal wafer piece.

That is to say, as shown in FIG. 7, the crystal device 20 includes a vibration portion 22a thereinside, and is configured as a package type crystal oscillator. This crystal device 20 is formed by laminating a base member 21, a crystal substrate 22, and a lid 23, and a frame portion 22g and a vibration portion 22a are formed on the crystal substrate 22, with the vibration portion 22a accommodated in an accommodating space 22d that is made a vacuum atmosphere, and sealed air tight.

Furthermore, on both main faces of the vibration portion 22a there is formed a thick portion 22e, and on both main faces of the thick portion 22e there is formed an excitation electrode 22b. In addition, a thin portion 22f is formed surrounding the thick portion 22e, and a frequency adjustment metal film 22c is formed on the thin portion 22f on the free end side.

Furthermore, through hole wiring 21a is formed in the base member 21, so that an inside electrode 22h provided on the bottom face of the vibration portion 22a, and an electrode pad 21b provided on the outer bottom face of the base member 21 are electrically connected.

In performing frequency adjustment of the crystal piece of the surface mounted crystal oscillator of the fourth embodiment, at first, the lid wafer and the framed crystal piece wafer are connected, then the excitation electrode 22b is trimmed from the direction of arrow J, to effect course adjustment, and then the base wafer is connected to the framed crystal piece wafer, after which the laser is irradiated (in the direction of arrow K), onto the frequency adjustment metal film 22c from above of the lid 23 that has transmittance, to penetrate through the lid 23 and effect trimming, and fine tune the frequency of the vibration portion 22a.

(Other Matters)

For the crystal device of the present invention, a metal which is different for the excitation electrode 10 and the frequency adjustment metal film 13 may be used. Furthermore, even if the crystal piece 3d shown in the abovementioned embodiments is used for a crystal oscillator that uses an IC chip on which an oscillation circuit is formed, the same effects as for the second embodiment can of course be achieved.

What is claimed is:

1. A crystal device having:
   a crystal piece having a thick portion and a thin portion, with an excitation electrode formed on both main faces of said thick portion, and a lead out electrode electrically connected to said excitation electrode, formed on an end portion;
   a container main body having a concavity for accommodating said crystal piece; and
   a cover that is connected to an open end face of said container main body and hermetically seals said crystal piece, wherein
   a frequency adjustment metal film which is electrically isolated from said excitation electrode and made independent, is formed on said thin portion of said crystal piece.

2. A crystal device according to claim 1, wherein said frequency adjustment metal film is formed on an area separated from said thick portion which is an outer peripheral portion of said crystal piece.

3. A crystal device comprising:
   a base with a crystal retention terminal formed on an upper face, and a mount terminal that is electrically connected to said crystal retention terminal formed on an outer bottom face;
   a crystal piece mounted on said base, with an excitation electrode formed on both main faces, and with a support electrode that is electrically connect to an excitation electrode using a connection electrode formed on both sides of one end portion, and with said support electrode bonded to said crystal retention terminal with an electroconductive adhesive; and
   a lid that is connected to an outer edge face of said base, and that has a concavity in which said crystal piece is hermetically sealed, wherein
   said crystal piece has a thick portion and a thin portion, and an excitation electrode is formed on both main faces of said thick portion, and a lead out electrode that is electrically connected to said excitation electrode is formed on an end portion, and a frequency adjustment metal film which is electrically isolated from said excitation electrode and made independent, is formed on said thin portion of said crystal piece.

4. A crystal device according to claim 3, wherein said frequency adjustment metal film is formed on an area separated from said thick portion which is an outer peripheral portion of said crystal piece.

5. A crystal device comprising:

a base having a concavity in an upper face, and with a crystal retention terminal formed on an inner bottom face of said concavity, and a mount terminal that is electrically connected to said crystal retention terminal formed on an outer bottom face;

a crystal piece accommodated in said concavity, with an excitation electrode formed on both main faces, and with a support electrode that is electrically connect to an excitation electrode using a connection electrode formed on both sides of one end portion, and with said support electrode bonded to said crystal retention terminal with an electroconductive adhesive; and a cover that is connected to an outer edge face of said base, and that hermetically seals said crystal piece, wherein said crystal piece has a thick portion and a thin portion, and an excitation electrode is formed on both main faces of said thick portion, and a lead out electrode that is electrically connected to said excitation electrode is formed on an end portion, and a frequency adjustment metal film which is electrically isolated from said excitation electrode and made independent, is formed on said thin portion of said crystal piece.

6. A crystal device according to claim 5, wherein said frequency adjustment metal film is formed on an area separated from said thick portion which is an outer peripheral portion of said crystal piece.

7. A crystal device having:

a crystal substrate, in which a vibration portion with an excitation electrode formed on both main faces, and a frame portion that surrounds said vibration portion, are integrally formed;

a lid connected to an upper face of said frame portion; and a base connected to a lower face of said frame portion, and in which said vibration portion is hermetically sealed by said frame portion, said lid, and said base, wherein said vibration portion has a thick portion and a thin portion, and said excitation electrode is formed on both main faces of said thick portion, and a frequency adjustment metal film which is electrically isolated from said excitation electrode and made independent, is formed on said thin portion of said vibration portion.

* * * * *